United States Patent [19]
Moran et al.

[11] Patent Number: 5,169,676
[45] Date of Patent: Dec. 8, 1992

[54] CONTROL OF CRYSTALLITE SIZE IN DIAMOND FILM CHEMICAL VAPOR DEPOSITION

[75] Inventors: Mark B. Moran; Linda F. Johnson; Karl A. Klemm, all of Ridgecrest, Calif.

[73] Assignee: The United States of America as represented by the Secretary of the Navy, Washington, D.C.

[21] Appl. No.: 702,663

[22] Filed: May 16, 1991

[51] Int. Cl.⁵ .................. B05D 3/06; C23C 16/26
[52] U.S. Cl. .................. 427/575; 427/249; 427/122; 427/577; 428/408; 423/446
[58] Field of Search .......... 427/249, 122, 45.1, 427/39, 38; 428/408; 423/446; 118/723

[56] References Cited

U.S. PATENT DOCUMENTS

| | | | |
|---|---|---|---|
| 4,940,015 | 7/1990 | Kobashi et al. | 118/723 |
| 4,988,421 | 1/1991 | Drawl et al. | 427/255 |
| 5,015,494 | 5/1991 | Yamazaki | 427/39 |

FOREIGN PATENT DOCUMENTS

| | | |
|---|---|---|
| 2-9787 | 1/1990 | Japan . |
| 2-104664 | 4/1990 | Japan . |

OTHER PUBLICATIONS

SDJD/IST—ONR Diamond Technology Initiative Symposium, 11-13 Jul. 1989, paper T5; Office of Naval Research, Washington, D.C.; Lee, Y. H., et al., "Electron controlled CVD of Diamond Thin Films on Various Substrates".

SDJD/IST—ONR Diamond Technology Initiative Symposium, 11-13 Jul. 1989, paper TP11; Office of Naval Research, Washington, D.C.; Tzeng, Y. et al., "Diamond Thin Films Grown by Spiral Hollow Cathode Plasma Assisted Chemical Vapor Deposition".

Applied Physics Letters, vol. 60, No.6, 10 Feb. 1992, pp. 698–700; Stoner, B. R., et al., "Textured Diamond Growth on (100) B-SiC via Microwave Plasma Chemical Vapor Deposition".

*Primary Examiner*—Shrive Beck
*Assistant Examiner*—Roy V. King
*Attorney, Agent, or Firm*—Stephen J. Church; Melvin J. Sliwka; John L. Forrest, Jr.

[57] ABSTRACT

In depositing an adhering, continuous, polycrystalline diamond film of optical or semiconductor quality on a substrate, as by forming on the substrate a layer of a refractory nitride interlayer and depositing diamond on the interlayer without mechanical treatment or seeding of the substrate or the interlayer, the substrate is heated in a vacuum chamber containing a microwave activated mixture of hydrogen and a gas including carbon, and the size of deposited diamond crystallites and their rate of deposition selectively varied by a bias voltage applied to the substrate.

11 Claims, 2 Drawing Sheets

CONTROL OF CRYSTALLITE SIZE IN DIAMOND FILM CHEMICAL VAPOR DEPOSITION

BACKGROUND OF THE INVENTION

1. Field of the Invention

The present invention pertains to coating processes using vapor deposition of coatings including diamond.

2. Description of the Prior Art

The carbon allotrope diamond has many potential uses. Diamond has extreme hardness, resistance to thermal and mechanical shock, and transparency to a wide range of electromagnetic wavelengths from ultraviolet through visible and infrared radiation to microwaves. Diamond would thus be an unexcelled coating for transmitting, reflecting, and absorbing optical and microwave elements subjected to weather, particulate erosion, and high energy radiation. Diamond also has high thermal conductivity, high hole mobility, and high electrical resistivity when pure, and functions as a semiconductor when doped. Diamond would thus make integrated circuits and other electrical and electronic devices incorporating a diamond film unexcelled for operation at high temperature, for convenience of cooling, and where transparency, environmental resistance, and radiation resistance are desirable.

The chemical vapor deposition (CVD) of a film of polycrystalline diamond from an activated gaseous mixture which includes a gas containing carbon is well-known and would appear to make these potential uses practical However, diamond films deposited heretofore by CVD on a non-diamond substrate do not adhere thereto sufficiently for practical purposes unless the substrate, is first seeded with diamond particles as by abrasion of the substrate with diamond grit. As a result of the abrasion and seed particles, the substrate is irregular and the crystallites forming the deposited film are irregular in size and spacing, very defected, and without preferred crystal orientation. The substrate and diamond film of the prior art are thus too irregular for use as an optical coating although continuous and smooth polycrystalline films are well-suited as optical coatings. Although prior art CVD diamond may be usable as a relatively massive heat sink, prior art CVD diamond is too irregular for use as an electrical insulating or thermal conducting layer within an integrated circuit.

The irregularities of prior art CVD diamond films may be disadvantageous for mechanical protection even where optical and electrical properties are irrelevant. For example, a very thick diamond layer may be rapidly deposited using a plasma torch or jet in which the carbon containing gas, which may be a portion of a flame, is activated by discharging the gas through an electric arc. However, the resulting diamond layer is so irregular and the crystallites so imperfectly joined that the layer has, despite its thickness, relatively poor resistance to weathering.

The deposition, in a chamber containing gas at a pressure less than atmospheric, of a film or layer of a material onto a substrate is, of course, well-known. Such vacuum deposition may be carried out by sputtering where ions of a gas, typically argon heated by microwave energy, eject atoms to be deposited from a target of the material so that the freed atoms travel to an adjacent substrate and are deposited thereon. Movement of such freed atoms to the substrate may be motivated by a suitable electric potential between the target and substrate. An oxide or nitride of the target material may be deposited by including, respectively, oxygen or nitrogen in the gas in the chamber. Suitable materials, structures, temperatures, and pressures for sputtering deposition of oxides and nitrides of a variety of elements on a variety of substrate materials are readily available for selection by one skilled in the art of vacuum deposition.

In chemical vapor deposition, atoms to be deposited on a substrate are provided as atoms in molecules of a gas present in the chamber and activated while in contact with the substrate. Typically, the gas is activated by heating the gas by microwave energy, a hot filament, electric discharge, or combustion so that the gas releases free radicals containing the atoms to be deposited on the substrate. Typically in CVD, no electric potential relative to the substrate is provided, and the substrate is maintained at a suitable temperature by electrical resistance or induction heating.

In deposition of diamond by CVD, a gas containing the carbon which forms the diamond is provided as small proportion of a gaseous mixture in the chamber, the balance of the gas being predominately hydrogen Such a mixture may be activated by microwave energy at a frequency which excites the hydrogen molecule. The carbon containing gas is usually methane which is readily obtained in a pure state and is present in the mixture at a proportion less than 5% and, typically, 0.5% to 2%. However, the necessary carbon-containing free radicals may be obtained from vapors of other hydrocarbons, alcohols, or the like. It is known in diamond CVD to add a small amount of oxygen to the mixture of hydrogen and carbon containing gas, the proportion of oxygen being substantially less than that of methane. The oxygen serves to increase the rate and quality of diamond deposition by oxidizing graphite which, depending on the deposition conditions, may be deposited along with the diamond.

Diamond may be deposited by CVD over a wide range of conditions. The vacuum chamber may be maintained at a pressure of 0.1 to 100 Torr by pumping while providing new gaseous mixture. The substrate is maintained at 550° to 1100° C. In general higher pressures increase the rate of diamond deposition as do higher substrate temperatures up to 900° or 1000° C. In prior art diamond CVD, variations in substrate temperature, in gas activation method and temperature, in the proportion of carbon providing gas, and in the method of substrate abrasion provide some control over the crystallite size and growth rate size and over the irregularity of the deposited diamond. However, in all prior art diamond CVD the deposited diamond is, as before stated, highly irregular.

It is apparent that, in optical applications of a polycrystalline film and even if crystallites thereof are regular and substantially undefected, smaller crystallites are desirable to reduce scattering. However, CVD diamond film deposition conditions that provide smaller crystallites also generally result in slower film growth rate. It would, therefore, be highly desirable, in a method for CVD deposition of optical quality diamond film, to provide for deposition of very small crystallites. It would be particularly desirable in such a method to grow a film of small crystallites without prohibitive reduction in film growth rate and to provide, selectively, for more rapid growth of a film of larger but still regular crystallites where these are acceptable.

SUMMARY AND OBJECTS OF THE INVENTION

In a method of forming a adhering, continuous diamond film of optical or semiconductor quality on a substrate, the film is formed of substantially regular and undefected crystallites deposited as a polycrystalline diamond layer on a refractory nitride interlayer from a gaseous mixture of hydrogen and a gas, such as methane, containing carbon, the substrate and the interlayer being heated and the gaseous mixture being activated by microwave energy. In such a method, the size of crystallites being deposited to form the diamond film is selected by varying a bias voltage applied to the substrate, a relatively more positive bias of the substrate providing smaller crystallites while maintaining a useful growth rate and a relatively less positive bias providing larger, but still regular, crystallites and a faster growth rate.

It is an object of the present invention to provide a polycrystalline diamond film of sufficiently high quality for optical and semiconductor uses.

Another object is to provide a method which deposits such a diamond film and in which the size of crystallites forming the film may be made relative small to minimize optical scattering while maintaining a relatively rapid growth rate.

A further object is to provide such a method wherein the size of the deposited crystallites may, selectively, be relatively small or be relatively large to promote growth of the film.

BRIEF DESCRIPTION OF THE DRAWINGS

Other objects, advantages, and novel features of the subject invention will become apparent from the following detailed description when considered with the accompanying drawings in which.

DETAILED DESCRIPTION

Figure 1:
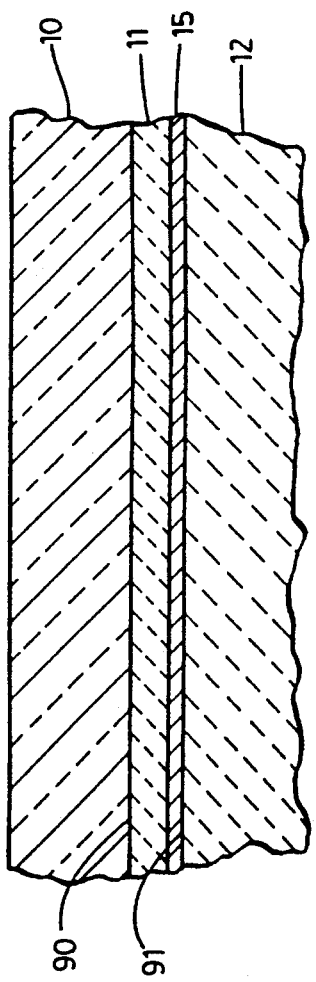
FIG. 1 is a diagram representing a polycrystalline diamond film deposited in accordance with the method of the present invention for varying the size of deposited crystallites of the film, the film being disposed on a substrate together with an interlayer.

FIG. 1 is a fragmentary representation of a layered structure, such as an optical element, including a high quality, continuous, polycrystalline diamond film 10 deposited by chemical vapor deposition wherein the crystal orientation is selected in accordance with a method of the present invention.

Film 10 is deposited directly on a refractory nitride interlayer 11 which is, in turn, deposited on a substrate 12. The layered structure is depicted as including an adhesion interlayer 15 which is deposited directly on the substrate 12, the nitride interlayer 11 being deposited directly on the adhesion interlayer. However, the nitride interlayer may be deposited directly on the substrate when the nitride interlayer and substrate are formed of certain materials and when certain methods of deposition are used to deposit the interlayer; or the nitride may be provided as any suitable bulk material instead of being deposited as an interlayer. The interlayers 11 and 15 may be deposited by any suitable methods which are not involved in the subject invention. Also, any suitable material may be used for the substrate 12 and for the adhesion interlayer 15, and the nature of these materials also is not a part of the subject invention. It will be subsequently apparent that the relative thicknesses shown for layers 10, interlayers 11 and 15, and substrate 12 are not to scale, but are selected for illustrative convenience. Further, it will be apparent to one skilled in the art that in an article of manufacture having a diamond layer, such as layer 12, the diamond layer may itself have subsequently deposited thereon an additional layer or coating; that a substrate, such as substrate 12, may itself be deposited on a base substrate; and that, after deposition of the diamond layer, any or all of the interlayers and substrate may be removed, as by etching, leaving the diamond layer and any unremoved interlayer.

Figure 2:
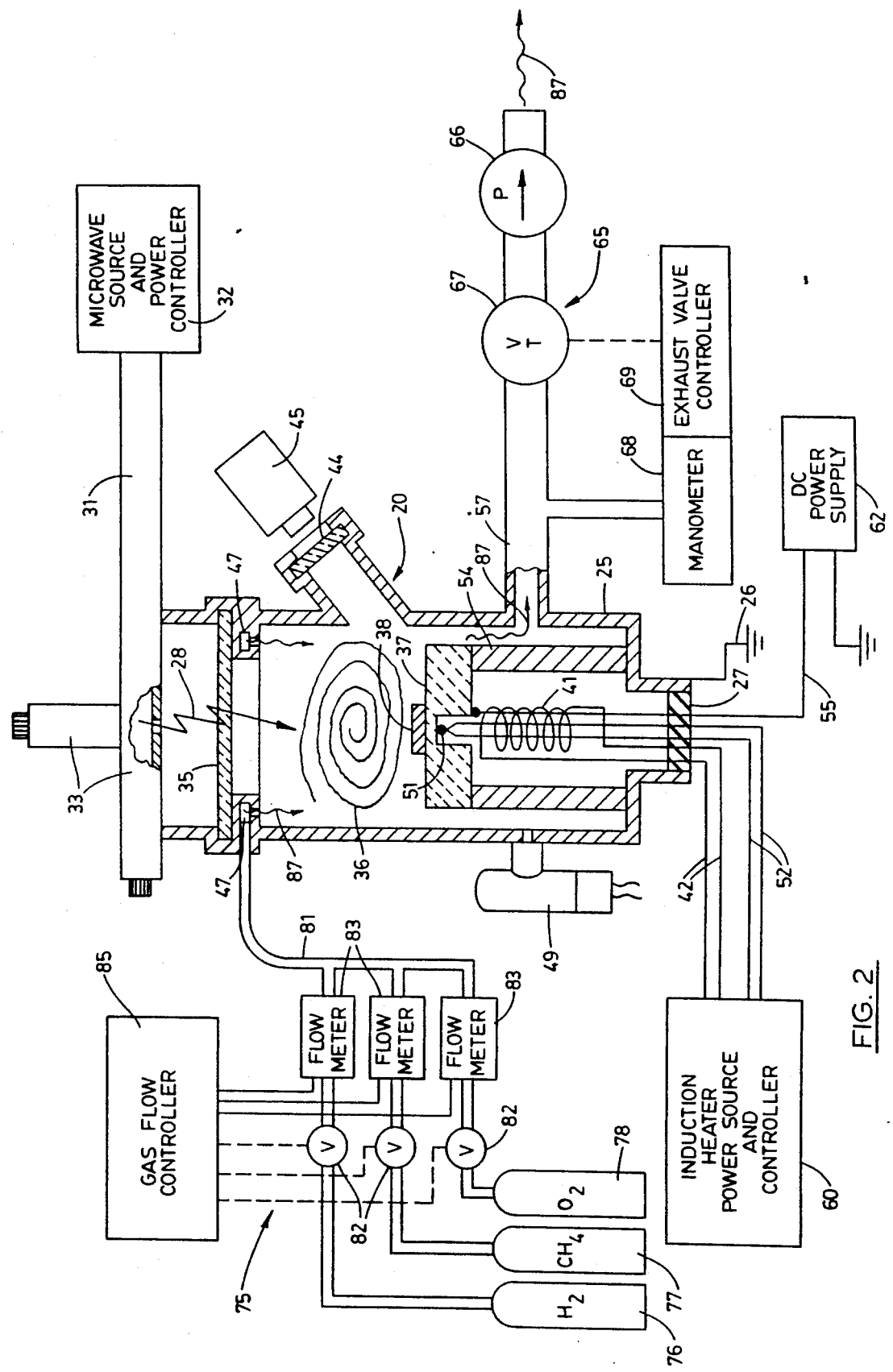
FIG. 2 is a diagram of a representative vacuum chamber and associated apparatus for depositing such a diamond film on the substrate in accordance with the method of the present invention.

A representative vacuum chamber 20 and associated apparatus as used in the practice of methods embodying the present invention are shown in FIG. 2. The chamber and other apparatus, which are all well-known in the art of chemical vapor deposition (CVD) and which are, therefore, schematically represented, will be briefly described at this point before describing in detail methods embodying the present invention.

Chamber 20 has a cylindrical side wall 25 and opposite upper and lower walls. These walls are, typically, constructed of stainless steel and are connected to a system ground 26. The lower wall has a vacuum feedthrough indicated by numeral 27, and the upper wall has a slot for admission of microwave energy indicated by numeral 28. This energy is, typically, at 2.45 GHz for resonance with hydrogen molecules and is provided through a waveguide 31 from a microwave source and power controller 32 which provides a selected level of microwave energy to the waveguide. Since reflected microwave energy from the chamber may be minimized by adjustment of tuning stubs 33, this level is substantially that provided to the chamber. A quartz window 35 isolates the chamber interior physically from the microwave supplying elements, but passes microwave energy to form a plasma ball 36 of activated gas within the chamber and above an electrically and thermally conductive graphite stage 37. This stage mounts an item 38 consisting of substrate 12 and nitride interlayer 11 for deposition of diamond film 10 from the activated gas. The substrate portion opposite the interlayer is engaged with the stage for heating therewith by an induction heating coil 41 extending from the stage oppositely of the item and energized through leads 42 extending through feedthrough 27. The portion of item 38 opposite stage 37 is heated primarily by thermal conduction from the stage, and the surface of this portion contacted by the plasma ball and undergoing diamond deposition therefrom is viewable through a window 44 in wall 25 by an optical pyrometer 45 for determining the exact temperature of such surface. Chamber 20 has a ring manifold 47 disposed adjacent to quartz window 35 for distributing gas to the chamber interior and has a connection through wall 25 to an ionization gage 49 for precise measurement of the vacuum within the chamber. A thermocouple 51 engages stage 37 oppositely of, but adjacent to, item 38, and leads 52 extend from the thermocouple through feedthrough 27. Stage 37 is mounted on an alumina cylinder 54 disposed concentrically with wall 25 and about coil 41. Cylinder 54 insulates stage 37 electrically and thermally from the chamber walls, and a lead 55 provides electrical connection through feedthrough 47 to stage 37. Chamber 20 has an exhaust conduit 57 through wall 25.

The apparatus associated with chamber 20 includes an induction heater power source and controller device 60 connected to thermocouple leads 52 to sense the temperature of stage 37, which corresponds to the temperature of the item 38 surface exposed to plasma ball 36. Device 60 is connected to leads 42 to energize coil 41 so as to maintain the stage at a selected temperature measured by thermocouple 51 and corresponding to a desired temperature of such surface as measured by pyrometer 45. A DC power supply 62 is connected between lead 55 and ground and is adapted to maintain a selected DC bias voltage in a range of about positive 20 volts to about negative 80 volts between wall 25, within which is plasma ball 36, and stage 37 so that this bias voltage is substantially that between such surface of item 38 and wall 25.

The associated apparatus also includes an exhaust system, which is indicated generally by numeral 65, for maintaining a selected pressure in the range of about 20-50 torr in chamber 20 while feed gas is being provided to the chamber. System 65 has a vacuum pump 66 connected to conduit 57 for continuously withdrawing a flow of gas from the chamber and has an exhaust valve 67 for selectively throttling this flow. A precision manometer 68 is connected to conduit 57 for measuring the vacuum in chamber 20, and the manometer is connected to a controller 69 for exhaust valve 66. Controller 69 is adapted to actuate valve 67 in accordance with signals from manometer 68 so as to maintain a selected such vacuum which may be monitored by ionization gage 49.

The associated apparatus further includes a gas supply system 75 connected between ring manifold 47 and bottles 76-78 which contain, respectively and for the purposes of the present invention, hydrogen, methane, and oxygen. System 75 is adapted to provide to chamber 20 a selected flow of any gas or of any predetermined mixture of gases from the bottles. Each bottle is connected to a supply manifold 81, which communicates with ring manifold 47, through a control valve 82 and a flow meter 83. A gas flow controller 85 receives signals from meters 83 and provides signals to valves 82 so as to maintain the selected gas flows from each bottle 76-78.

When chamber 20 and the associated apparatus are in operation and as indicated by arrows 87, the selected gas or gas mixture enters the chamber at a selected flow rate and participates in the plasma ball 36 while gases resulting therefrom and any other gases are continuously withdrawn by the exhaust system at a rate determined by valve 67. A selected pressure is thus maintained in the chamber for CVD deposition or other action related to the deposition of a diamond layer such as layer 10.

The subject invention involves the discovery by the applicants that, without either mechanical treatment, such as abrasion with diamond grit, or seeding with diamond particles, a continuous, adhering, polycrystalline diamond film 10 is depositable on a substrate 12 by CVD from an activated gaseous mixture including hydrogen and a gas providing the carbon for formation of diamond crystallites making up the film. Since such treatment or seeding are not required with the present invention, the smoothness, crystallite regularity, and continuity of the deposited film are not adversely affected by physical irregularities introduced in prior art CVD diamond deposition requiring such treatment and seeding. As a result, a diamond film deposited by CVD in accordance with the present invention is of high quality and suited for protective coatings or other uses in optical elements and for layers or elements of an integrated circuit or other semiconductor device.

In the practice of the present invention as represented in FIG. 1, a nitride interlayer 11 is first deposited on the substrate 12 and the diamond film is deposited directly on a surface 90 of the interlayer opposite the substrate. The nitride interlayer, as before stated, is deposited directly on the substrate or on an adhesion layer, such as layer 15, which is directly deposited on a surface 91 of the substrate. Since neither surface 90 or 91 or the adhesion layer are abraded with diamond grit or otherwise mechanically abraded or treated or seeded with diamond or other material before depositing the diamond film, surfaces 90 and 91 are smooth.

The thermodynamic conditions for CVD deposition of diamond instead of graphite, where the diamond is deposited at a useful rate and with useful purity, are the same for the subject invention as in the above discussed prior art deposition of diamond by CVD from a gaseous mixture of hydrogen and a gas, such as methane, containing carbon which forms the diamond. These conditions require that the surface on which such deposition occurs, such as surface 90, have a temperature in the range of about 600 to about 1100° C. since lower temperatures result in substantially no deposition and higher temperatures result in the deposition of graphite only. The above-described conditions for CVD diamond deposition in the prior art, such as pressures in a range of 0.1 to than 5% methane, and the use of oxygen in the mixture also apply to CVD diamond deposition in accordance with the present invention. As a result, it is believed that, as in the prior art and in addition to the type of apparatus shown in FIG. 2 and the conditions set forth in the following examples, the present invention may be also be practiced using carbon sources other than methane and may be practiced with any suitable apparatus, amount of microwave power for activation, or other source of activation energy.

It is apparent that a nitride used to form interlayer 11 must resist the deposition temperatures set forth above of at least about 600° C.; that is, the nitride must be refractory or resistant to heat. The present invention has been effectively practiced with silicon nitride, which is refractory and was disposed in an interlayer 11 deposited by the well-known RF diode sputtering process on a substrate 12 bearing a silicon dioxide adhesion layer 15 about 100 to 200 angstrom units in thickness. It is believed that the invention may be equally effective with other refractory nitrides, for example but not limited to, aluminum nitride, boron nitride, hafnium nitride, zirconium nitride, tantalum nitride, niobium nitride, vanadium nitride, and titanium nitride deposited by any suitable process such as RF sputtering or by DC magnetron sputtering.

For the practice of the subject invention it is necessary that the refractory nitride, such as that of interlayer 11, be sufficiently thick and regular to allow substantial and regular diamond nucleation. If the nitride interlayer is too thin, it may be so damaged by the highly erosive activated hydrogen of the plasma ball 36 that such nucleation does not occur. A thickness for interlayer 11 of at least 500 angstrom units has been found satisfactory, and this thickness allows the surface 90 to be effectively cleaned by exposure to a plasma ball 36 of substantially pure hydrogen for a few minutes prior to introduction of methane to commence diamond deposition. It has been found that the use of oxygen in the gaseous mixture, which is provided by system 75 for plasma ball 36, when the methane is initially introduced may result in such oxidation of the nitride inter layer 11 that no diamond film 10 is deposited thereon. However, if the gaseous mixture is substantially free from oxygen at the beginning of diamond deposition so that the nitride interlayer is not oxidized, oxygen may be introduced into the mixture after a sufficient thickness of diamond layer 10 has been deposited to protect the nitride, the oxygen then promoting faster growth and purity of the subsequently deposited diamond. The subject invention is, typically, carried out using a refractory nitride interlayer 11 about 2500 angstrom units in thickness; however, it is believed by the applicants that such a layer of refractory nitride material of any practical thickness or bulk nitride material which is sufficiently dense, regular, and free from interstices for widespread diamond nucleation may be coated with a diamond film 10 in which the size of diamond crystallites being deposited to form the film is controlled in accordance with the subject invention.

The present invention is thus a method to control the size of such diamond crystallites being deposited by CVD directly on a surface of refractory nitride material to form the continuous, adhering, polycrystalline film 10 of the crystallites. It is evident that the crystallites are deposited from an activated gaseous mixture including hydrogen and a gaseous compound, such as methane, which provides the carbon from which the crystallites are formed; and that the crystallites are deposited on a substrate. This substrate may be the refractory nitride material itself or may be some other material, such as that of the substrate 12, on which the refractory nitride is deposited, as by sputtering, to a thickness of at least about 500 angstrom units. The present invention has been found effective with the crystallites being deposited on such a surface which is maintained at temperature within the range of 600° to 1100° C. from such a mixture which consists predominately of hydrogen, is activated by microwave energy, and is at a pressure below about 100 torr and, typically, in a range of about 20 to about 50 torr.

It is apparent that the crystallites forming film 10 are deposited in a chamber, such as chamber 20, by a providing therein a substrate, such as the substrate 12, on which the crystallites are deposited. The chamber has a wall, typified by wall 25, within which is disposed the substrate and activated gas which forms plasma ball 36 and provides the carbon from which the crystallites are formed. The present invention is characterized by providing an electrical bias voltage of the substrate relative to the wall, the wall being electrically insulated from the substrate in any suitable manner typified by the alumina cylinder 54, and the bias voltage being provided in any suitable manner typified by DC power supply 62. Under typical conditions for effective diamond film deposition as set forth in the following examples, giving the substrate a relatively more positive bias voltage in relation to the wall has been found to promote growth of relatively smaller crystallites while giving the substrate a relatively more negative bias voltage in relation to the wall has been found to promote the growth of relatively larger crystallites. Such bias voltages in a range of about 25 volts positive to about 80 volts negative have been used in the practice of the present invention.

It is desirable in certain polycrystalline film applications, such as coatings for optical elements, that the crystallites be small and well ordered, and the use of such a bias voltage of about 20 volts positive in typical CVD diamond film deposition conditions, such as those set forth above, has been found to provide such desirable small and well ordered diamond crystallites. While the deposition of diamond small crystallites may occur by CVD without using the electrical bias of the present invention, such unbiased deposition requires the use of relatively lower gaseous mixture pressures and correspondingly lower microwave power. As a result, the rate of deposition is slower than when a bias voltage is used in accordance with the present invention, the crystallites also being less ordered than when such a bias is used.

EXAMPLES

In the following examples and prior to chemical vapor deposition (CVD) of diamond in accordance with the subject invention, substrates and interlayers were provided by well-known techniques as follows:
 silicon was provided as 99.999% purity targets for sputtering and as single crystal wafers for substrates;
 silicon dioxide adhesion layers were deposited by RF diode sputtering from a silicon target in an argon and oxygen mixture to a thickness in the range of 50-100 angstrom units; and
 silicon nitride was deposited by RF diode sputtering from a silicon target in an argon and nitrogen oxygen mixture to a thickness of 2500 angstrom units.

In the following examples, deposition of diamond by CVD in accordance with the subject invention was carried out in a 1.5 kw microwave reactor system including a vacuum chamber, microwave generator, and induction substrate heating. This system, a high pressure microwave system made by Applied Science and Technology Inc. of Cambridge, Mass., is of well-known construction, corresponds to that schematically represented in FIG. 2. An electrical bias was provided for the substrate by a conventional DC power supply. The vacuum pumping system was capable of providing a vacuum of $10^{-4}$ torr and the vacuum was monitored and controlled by a capacitance manometer. The manometer was calibrated by a an ionization gauge. Hydrogen, methane, and oxygen were provided to the reactor system by a computer controlled and mass flow monitored system. The substrate temperature was monitored and controlled by a thermocouple received in a graphite stage mounting the substrate, and the exact substrate temperature was determined by an optical pyrometer viewing the substrate through a window of the chamber.

The substrate bias was the direct current voltage of the substrate relative to the chamber wall.

Neither the substrate, silicon dioxide adhesion layer, or silicon nitride layer were abraded with diamond or other grit or seeded with diamond.

The deposited diamond was examined for film uniformity, crystallite size, and crystal orientation by a scanning electron microscope (SEM).

EXAMPLE I

A substrate coated by RF diode sputtering with a silicon dioxide adhesion layer and then with a silicon nitride layer was utilized. The substrate was brought to 850° C. and the chamber vacuum pumped for 20 minutes. Hydrogen flow was then started, the chamber pressure set to 25 torr, and microwave power turned on to initiate the plasma ball. The hydrogen flow was then set to 176.8 sccm, the chamber pressure set to 45 torr, the microwave input power adjusted to 900 watts, and the microwave tuning stubs adjusted to minimize reflected microwave power. For cleaning, the silicon nitride layer was then etched for 5 minutes in the hydrogen plasma. The substrate bias was turned on and set to a positive 20 volts. Methane flow was then started and set to 4.2 sccm and the deposition continued for 2 hours. Oxygen flow was then started and set to 0.85 sccm, and the deposition continued for 8 hours.

The deposited diamond was examined and found to be a continuous film about 5 micrometers in thickness. The film growth rate was thus about 0.5 micrometers per hour. The film was formed of crystallites averaging 0.5 to 1.0 micron in diameter and generally ordered in the <111> and <100> planes.

EXAMPLE II

Example II was carried out substantially as in Example I except that the substrate bias was substantially zero instead of a positive 20 volts.

In the resulting film, the diamond crystallite size was 2-5 microns instead of 0.5-1 micron ; however the resulting film thickness in 10 hours was 2.5 micrometers, a film growth rate of 0.25 micrometers per hour, and the crystal structure was highly disordered.

EXAMPLE III

Example III was carried out substantially as in Example I except that the substrate bias was substantially a negative 20 volts instead of a positive 20 volts.

In the resulting film, the diamond crystallite size was 5-20 microns instead of 0.5-1 micron. The film growth was at a rate of 0.25 to 0.5 micrometers per hour.

EXAMPLE IV

Example IV was carried out substantially as in Example I except that the substrate bias was substantially a negative 80 volts.

No continuous diamond film formed, although sparse and very large crystallites, 10-30 microns in diameter, developed randomly over the silicon nitride interlayer.

When these examples and the foregoing description are considered, it is evident that many modifications and variations are possible in light of the teachings therein. It is, therefore, to be understood that within the scope of the appended claims the invention may be practiced other than as specifically set forth in the above description and examples.

What is claimed is:

1. A method of forming diamond crystallites, the method comprising:

providing a substrate having a surface of refractory nitride material;

depositing said diamond directly on said surface by chemical vapor deposition from an activated gaseous mixture within reaction chamber walls electrically insulated from said substrate, said mixture including hydrogen and a gas containing carbon; and providing said substrate with an electrical bias voltage relative to said walls for controlling the size of said crystallites.

2. The method of claim 1 wherein said bias voltage of said substrate relative to said walls is in a range of about 25 volts positive to about 80 volts negative.

3. The method of claim 2 wherein said bias voltage is made relatively more positive within said range to decrease the size of said crystallites and is made relatively more negative within said range to increase the size of said crystallites.

4. The method of claim 1 wherein said bias voltage is made relatively more positive to decrease the size of said crystallites and is made relatively more negative to increase the size of said crystallites.

5. The method of claim 1 wherein
   said refractory nitride material has a thickness of at least 500 angstrom units;
   said mixture is activated by microwave energy;
   said substrate is at a temperature in the range of about 550 to about 1100 degrees centigrade; and
   the pressure of said mixture is below about 100 Torr.

6. The method of claim 5 wherein said bias voltage is in a range of about 25 volts positive to about 80 volts negative.

7. In a chemical vapor deposition method for depositing a film of diamond crystallites on a substrate disposed within a reaction chamber walls together with an activated gas providing carbon from which said crystallites are formed, an improvement for controlling the size of said crystallites comprises providing a bias voltage of said substrate relative to said walls.

8. The improvement of claim 7 further comprising said bias voltage of said substrate relative to said walls being relatively more positive to decrease the size of said crystallites and being relatively more negative to increase the size of said crystallites.

9. In a chemical vapor deposition method for depositing a film of diamond crystallites on a substrate disposed within walls of a reaction chamber together with an activated gas providing carbon from which said crystallites are formed, an improvement for controlling the size of said crystallites comprising providing a bias voltage of said substrate relative to said walls.

10. The improvement of claim 7 further comprising said bias voltage of said substrate relative to said walls being in a range of about 25 volts positive to about 80 volts negative.

11. The improvement of claim 10 further comprising said bias voltage of said substrate relative to said walls being relatively more positive within said range of decrease the size of said crystallites and being relatively more negative within said range to increase the size of said crystallites.

* * * * *